United States Patent
Ruby et al.

(10) Patent No.: US 9,263,130 B2
(45) Date of Patent: *Feb. 16, 2016

(54) MEMORY DEVICE PAGE BUFFER CONFIGURATION AND METHODS

(71) Applicant: Micron Technology, Inc., Boise, ID (US)

(72) Inventors: Paul D. Ruby, Folsom, CA (US); Violante Moschiano, Bacoli (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/324,969

(22) Filed: Jul. 7, 2014

(65) Prior Publication Data

US 2014/0321205 A1    Oct. 30, 2014

Related U.S. Application Data

(63) Continuation of application No. 13/572,854, filed on Aug. 13, 2012, now Pat. No. 8,773,921, which is a continuation of application No. 12/612,248, filed on Nov. 4, 2009, now Pat. No. 8,243,529.

(51) Int. Cl.
| G11C 16/10 | (2006.01) |
| G11C 14/00 | (2006.01) |
| G11C 16/34 | (2006.01) |
| G11C 16/04 | (2006.01) |

(52) U.S. Cl.
CPC ........ G11C 14/0018 (2013.01); G11C 16/0483 (2013.01); G11C 16/3427 (2013.01)

(58) Field of Classification Search
CPC .............................. G11C 16/10; G11C 7/222
USPC ....................................... 365/189.05, 185.24
See application file for complete search history.

(56) References Cited

U.S. PATENT DOCUMENTS

| 7,400,532 | B2 | 7/2008 | Aritome |
| 8,243,529 | B2 | 8/2012 | Ruby et al. |
| 8,773,921 | B2 | 7/2014 | Ruby et al. |
| 2004/0008567 | A1* | 1/2004 | Furuyama ..................... 365/233 |
| 2006/0224820 | A1 | 10/2006 | Cho et al. |
| 2008/0140914 | A1 | 6/2008 | Jeon |
| 2009/0019215 | A1 | 1/2009 | Lee et al. |
| 2009/0161435 | A1 | 6/2009 | Park |
| 2009/0190401 | A1 | 7/2009 | Jeon et al. |
| 2011/0063919 | A1 | 3/2011 | Chandrasekhar et al. |
| 2011/0107014 | A1 | 5/2011 | Ruby et al. |
| 2012/0300549 | A1 | 11/2012 | Ruby et al. |

* cited by examiner

Primary Examiner — Michael Tran
(74) Attorney, Agent, or Firm — Schwegman Lundberg & Woessner, P.A.

(57) ABSTRACT

Memory devices and methods are described that include communication circuitry between page buffers in a memory array. Examples include communication circuitry that provide status information of page buffers that are directly adjacent to a given page buffer. The exchanged information can be used to adjust a given page buffer to compensate for effects in directly adjacent data lines that are being operated at the same time.

20 Claims, 3 Drawing Sheets

MEMORY DEVICE PAGE BUFFER CONFIGURATION AND METHODS

PRIORITY APPLICATION

This application is a continuation of U.S. application Ser. No. 13/572,854, filed Aug. 13, 2012, which is a continuation of U.S. application Ser. No. 12/612,248, filed Nov. 4, 2009, now issued as U.S. Pat. No. 8,243,529, all of which are incorporated herein by reference in their entirety.

TECHNICAL FIELD

Various embodiments described herein relate to apparatus, systems, and methods associated with semiconductor memories.

BACKGROUND

In semiconductor memories, there is continuous pressure in industry to reduce component dimensions and fit more components in a given amount of chip area. As dimensions shrink, numerous technical hurdles become more significant. For example in non-volatile memory devices, such as NAND memory, when data line spacing is reduced, adjacent data lines begin to affect each other during operation. One solution to this problem has been to only operate every other data line at one time. This approach simply ignores the effect of adjacent data lines by never operating adjacent data lines at the same time. Improved memory device configurations and methods are desired to provide improved device operation and ability to operate at smaller scales.

DETAILED DESCRIPTION

In the following detailed description of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and structural, logical, and electrical changes may be made.

Figure 1:
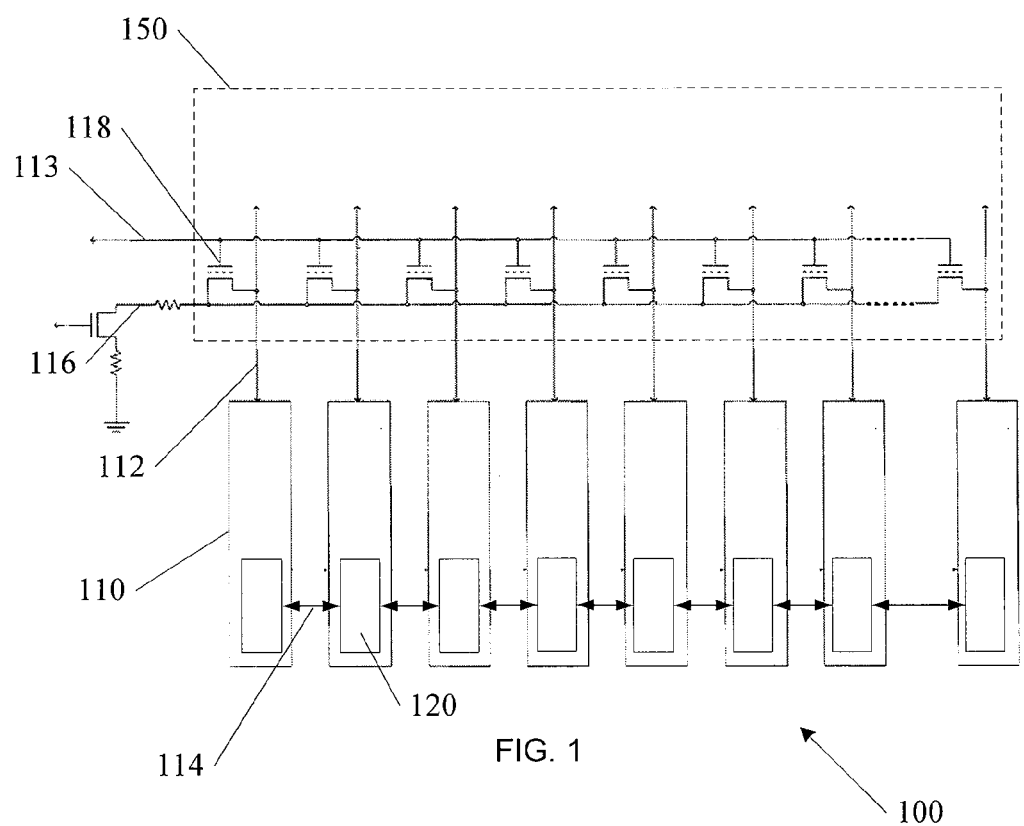
FIG. 1 shows a block diagram of a memory device according to an embodiment of the invention.

FIG. 1 shows selected portions of a memory device 100 according to an embodiment of the invention. The memory device includes an array 150 of memory cells. An example memory cell 118 is shown within the array 150. Types of memory cells 118 in the array 150 include flash memory cells in any suitable logical configuration, such as NAND, NOR, etc. In FIG. 1, an access line such as a word line 113, and a sourceline 116 are shown coupled to a row of memory cells 118. Although flash memory cells are used as an example, arrays with other types of memory cells can be used with embodiments of the invention.

A number of data lines, such as data lines 112, are shown leading into the array 150. In the example shown, each data line 112 is coupled to a page buffer 110. The page buffers 110 control the programming and reading activity of each data line 112. In one example, each page buffer 110 includes a logic block 120 that is used to control functions of the page buffer 110. Functions controlled by the logic blocks 120 include, but are not limited to data line voltage during a read operation; data line voltage during a program operation; an amount of time at a given data line voltage during various operations; etc. Although FIG. 1 illustrates an individual logic block 120 in each page buffer 110 to control each page buffer 110 and its corresponding data line status, other configurations are also within the scope of the invention. For example, more than one page buffer 110 may share a given logic block 120. In one example, the logic block 120 is implemented through a module. A module can be hardware, software, firmware, or combinations of the above.

FIG. 1 further illustrates an embodiment including communication circuitry 114 between the page buffers 110. Information about a status of a variable of each page buffer 110 can be passed from page buffer to page buffer using the communication circuitry 114. In one embodiment, each page buffer 110 is provided with information regarding a variable of one or more directly adjacent page buffers 110 using the communication circuitry 114. A status of each page buffer indicates a status of its corresponding data line 112. Possible variables include, but are not limited to, voltage levels, programmed state, time remaining in a current operation, etc. As discussed above, any of several data line variables and their status can affect operation and/or performance of directly adjacent data lines.

In one embodiment, the communication circuitry 114 is passive. The connections provide information at all times during device operation, and the information is used as needed. In other embodiments, the communication circuitry 114 is active. In an active configuration, the communication circuitry 114 is only activated when queried by for example an adjacent page buffer 110. Examples of implementation for communication circuitry include, but are not limited to, metal trace wiring, or other conductive traces, transistors or other switches, and/or other electrical signal pathways.

In one embodiment, because the communication circuitry 114 makes page buffer status and resulting data line status available to adjacent page buffers, the status in a given data line 112 can be compensated for in an adjacent data line 112. In one embodiment, a given page buffer 110 knows its own status (programming, reading, voltage setting, time scheduled for a give operation, etc.) and a status of its corresponding data line 112. The given page buffer 110 also checks a status of one or more directly adjacent page buffers 110 that correspond to their respective data lines 112. Then, the given page buffer 110 can make an adjustment to its own status, if necessary, to compensate for the status of the one or more adjacent page buffers 110. In this way, memory device configurations as discussed and illustrated can operate adjacent data lines at the same time without an unacceptable number of errors, or loss of performance.

Figure 2:
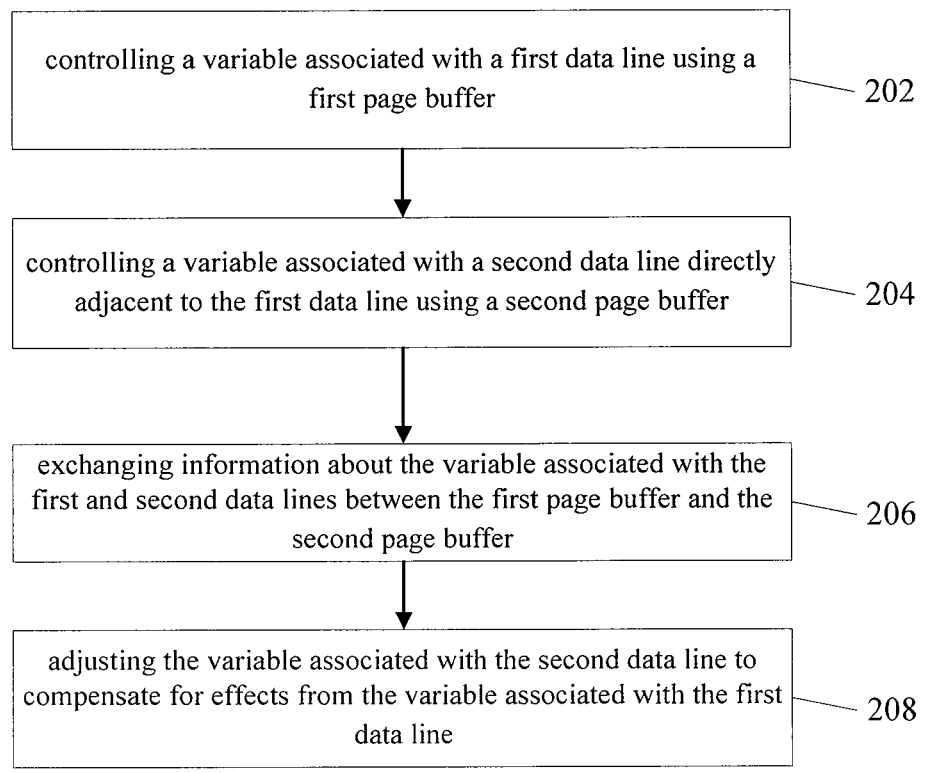
FIG. 2 shows a method of operating a memory device according to an embodiment of the invention.

FIG. 2 shows a flow diagram of an example method according to an embodiment of the invention, having selected similar attributes to configurations described above. In operation 202, a first variable is controlled on a first data line using a first page buffer. In operation 204, a second variable on a second data line directly adjacent to the first data line is controlled using a second page buffer.

In operation 206, information is exchanged between the first page buffer and the second page buffer. As discussed above, examples of information that can be exchanged includes, but is not limited to, data line voltages, types of operations being performed such as programming, reading, etc., length of time at a given voltage, etc. Other examples of information that can be exchanged includes an operational state of the page buffer, such as "currently programming" or "currently reading," "holding," etc.

In one embodiment, "holding" is used to describe a voltage put onto a data line to maintain the states of memory cells on the data line. The presence of a holding voltage provides a voltage barrier to ensure that a charge on a floating gate does not leak out and compromise performance.

In selected embodiments, different operations are compensated for differently, therefore information about an operational state can be used to respond to each of the different operations.

In operation 208, the second variable (for example voltage) on the second data line is adjusted to compensate for effects from the first variable (for example, voltage) on the directly adjacent first data line. In one example, a second voltage is raised to compensate for effects from the a voltage on the directly adjacent first data line. In one example, the second voltage is lowered to compensate for effects from the first voltage on the directly adjacent first data line. Although adjusting voltages as a method of compensation is used as an example, various embodiments of the invention are not so limited. Other variables such as programming time, reading time, etc. can also be adjusted to compensate for effects from adjacent data lines.

One challenge with operating directly adjacent data lines at the same time includes programming time being affected by directly adjacent data lines causing programming to occur too quickly. Such an issue of programming occurring too quickly is more important in selected memory devices, such as multistate memory devices. One example of multistate memory devices programs a gate of a memory cell with a plurality of threshold voltages to form the multiple memory states. In one example memory device according to an embodiment of the invention, any of a number of possible techniques to compensate and slow down a programming rate are utilized. As discussed above, examples include, but are not limited to, varying data line voltages and changing time allotted for a given operation such as programming or reading.

Figure 3:
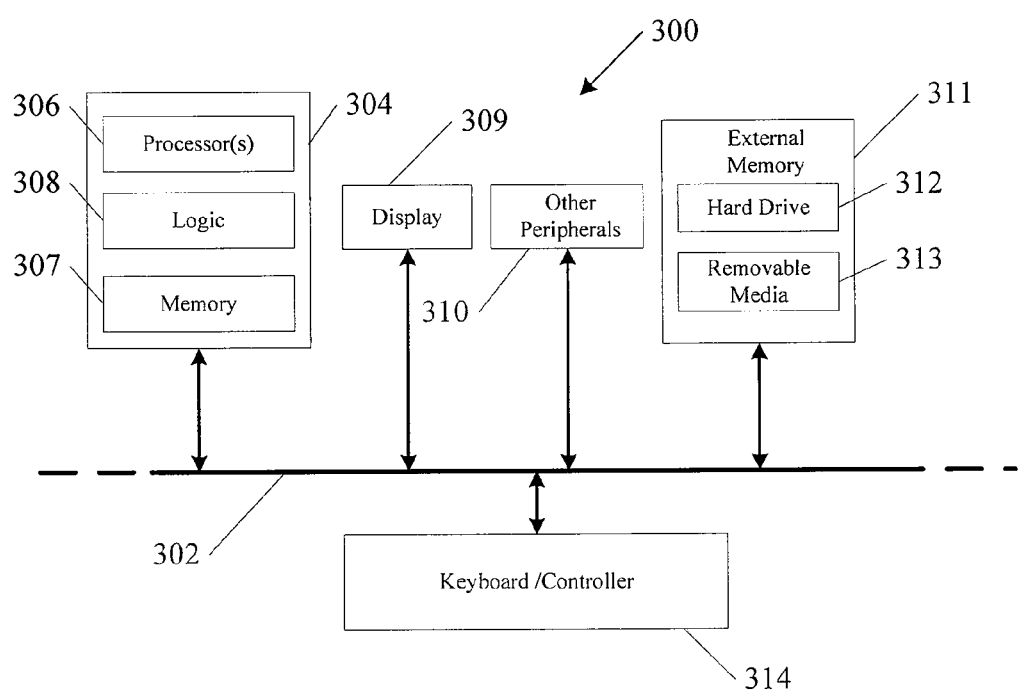
FIG. 3 shows an information handling system, including a memory device according to an embodiment of the invention.

An embodiment of an information handling system such as a computer is included in FIG. 3 to show an embodiment of a high-level device application. FIG. 3 is a block diagram of an information handling system 300 incorporating at least one chip or chip assembly 304 that includes a memory device 307 according to an embodiment of the invention. In one example, the memory device 307 includes a multistate memory device. The information handling system 300 shown in FIG. 3 is merely one example of a system in which the present invention can be used. Other examples include, but are not limited to, personal data assistants (PDAs), cellular telephones, MP3 players, aircraft, satellites, military vehicles, etc.

In this example, information handling system 300 comprises a data processing system that includes a system bus 302 to couple the various components of the system. System bus 302 provides communications links among the various components of the information handling system 300 and may be implemented as a single bus, as a combination of busses, or in any other suitable manner.

Chip assembly 304 is coupled to the system bus 302. Chip assembly 304 may include any circuit or operably compatible combination of circuits. In one embodiment, chip assembly 304 includes a processor 306 that can be of any type. As used herein, "processor" means any type of computational circuit such as, but not limited to, a microprocessor, a microcontroller, a graphics processor, a digital signal processor (DSP), or any other type of processor or processing circuit. Multiple processors such as "multi-core" devices are also within the scope of the invention.

In one embodiment, a memory device 307, such as a memory device described in embodiments above, is included in the chip assembly 304. Those skilled in the art will recognize that a wide variety of memory device configurations may be used in the chip assembly 304. Acceptable types of memory chips include, but are not limited to, Dynamic Random Access Memory (DRAMs) such as SDRAMs, SLDRAMs, RDRAMs and other DRAMs. Memory chip 307 can also include non-volatile memory such as NAND memory or NOR memory.

In one embodiment, additional logic chips 308 other than processor chips are included in the chip assembly 304. An example of a logic chip 308 other than a processor includes an analog to digital converter. Other circuits on logic chips 308 such as custom circuits, an application-specific integrated circuit (ASIC), etc. are also included in one embodiment of the invention.

Information handling system 300 may also include an external memory 311, which in turn can include one or more memory elements suitable to the particular application, such as one or more hard drives 312, and/or one or more drives that handle removable media 313 such as floppy diskettes, compact disks (CDs), digital video disks (DVDs), and the like. A memory constructed as described in examples above is included in the information handling system 300.

Information handling system 300 may also include a display device 309 such as a monitor, additional peripheral components 310, such as speakers, etc. and a keyboard and/or controller 314, which can include a mouse, or any other device that permits a system user to input information into and receive information from the information handling system 300.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. A system, comprising:
    a processor;
    a memory device coupled to the processor, the memory device including an array of memory cells arranged into data lines, wherein the data lines include:
        a first data line associated with a first plurality of memory cells;
        a second data line directly adjacent to the first data line and coupled to a second plurality of memory cells;
        a first page buffer operable to control an activity of the first data line;
        a second page buffer operable to control an activity of the second data line;
        communication circuitry coupled between the first and second page buffers and operable to pass information about a voltage associated with the second data line to the first page buffer; and logic to check a status of the first and second page buffers, and to adjust the status of the second page buffer to compensate for interference effects between the first and second data lines.

2. The system of claim 1, wherein the first plurality of memory cells and the second plurality of memory cells include DRAM memory cells.

3. The system of claim 1, wherein the first plurality of memory cells and the second plurality of memory cells are each connected in a NAND configuration.

4. The system of claim 1, wherein the logic includes a separate logic module located locally in each of the first and second page buffers.

5. The system of claim 1, wherein the logic comprises a module operable to adjust a voltage associated with the first data line responsive to at least the information about the voltage associated with the second data line.

6. The system of claim 5, wherein a module operable to adjust a voltage associated with the first data line responsive to at least the information about the voltage associated with the second data line comprises a module operable to adjust a voltage used during programming of a memory cell of the plurality of memory cells associated with the first data line responsive to at least the information about the voltage associated with the second data line.

7. The system of claim 5, wherein a module operable to adjust a voltage associated with the first data line responsive to at least the information about the voltage associated with the second data line comprises a module operable to adjust a voltage used during reading of a memory cell of the plurality of memory cells associated with the first data line responsive to at least the information about the voltage associated with the second data line.

8. A system, comprising:
   a processor;
   a memory device coupled to the processor, the memory device including an array of memory cells arranged into data lines, wherein the data lines include:
      a first data line associated with a first plurality of memory cells;
      a second data line directly adjacent to the first data line and coupled to a second plurality of memory cells;
      a first page buffer operable to control an activity of the first data line;
      a second page buffer operable to control an activity of the second data line;
      communication circuitry coupled between the first and second page buffers and operable to pass information about a voltage associated with the second data line to the first page buffer; and
      a module operable to adjust at least one of a variable associated the first data line and/or a variable associated with the second data line to adjust a programming time.

9. The system of claim 8, wherein the first plurality of memory cells and the second plurality of memory cells include DRAM memory cells.

10. The system of claim 8, wherein a module operable to adjust at least one variable comprises a module operable to slow down a time during which a memory cell of the memory cells associated with the first bit line is programmed responsive to at least the information about the voltage of the second data line.

11. The system of claim 8, wherein the communication circuitry is active.

12. The system of claim 8, wherein the communication circuitry is passive.

13. A system, comprising:
   a processor;
   a memory device coupled to the processor, the memory device including an array of memory cells arranged into data lines, wherein the data lines include:
      a first data line associated with a first plurality of memory cells;
      a second data line directly adjacent to the first data line and coupled to a second plurality of memory cells;
      a first page buffer operable to control an activity of the first data line;
      a second page buffer operable to control an activity of the second data line;
      communication circuitry operable to pass information about a programming operational state associated with the second page buffer to the first page buffer; and
   logic to check a status of the first and second page buffers, and to adjust the status of the second page buffer to compensate for interference effects between the first and second data lines.

14. The system of claim 13, wherein the processor includes a multi-core processor.

15. The system of claim 13, wherein the communication circuitry is active.

16. The system of claim 13, wherein the communication circuitry is passive.

17. A system, comprising:
   a processor;
   a memory device coupled to the processor, the memory device including an array of memory cells arranged into data lines, wherein the data lines include:
      a first data line associated with a first plurality of memory cells;
      a second data line directly adjacent to the first data line and coupled to a second plurality of memory cells;
      a first page buffer operable to control an activity of the first data line;
      a second page buffer operable to control an activity of the second data line;
      communication circuitry operable to pass information about a programming operational state associated with the second page buffer to the first page buffer; and
   a module operable to adjust a voltage associated with the first data line responsive to at least information about a voltage associated with the second data line and the voltage associated with the first data line.

18. The system of claim 17, wherein the first plurality of memory cells and the second plurality of memory cells include DRAM memory cells.

19. The system of claim 17, wherein the first plurality of memory cells and the second plurality of memory cells are each connected in a NAND configuration.

20. The system of claim 17, wherein the module includes modules located locally in each of the first and second page buffers.

* * * * *